(12) United States Patent
Takahashi

(10) Patent No.: US 6,501,683 B2
(45) Date of Patent: Dec. 31, 2002

(54) NONVOLATILE SEMICONDUCTOR MEMORY DEVICE

(75) Inventor: Keita Takahashi, Nara (JP)

(73) Assignee: Matsushita Electric Co., Ltd., Osaka (JP)

( * ) Notice: Subject to any disclaimer, the term of this patent is extended or adjusted under 35 U.S.C. 154(b) by 0 days.

(21) Appl. No.: 09/855,772

(22) Filed: May 16, 2001

(65) Prior Publication Data

US 2002/0001229 A1 Jan. 3, 2002

(30) Foreign Application Priority Data

May 19, 2000 (JP) ........................................ 2000-147807

(51) Int. Cl.$^7$ ............................................... H01L 27/04
(52) U.S. Cl. ............................ 365/185.25; 365/185.02; 257/48; 257/428
(58) Field of Search ..................... 365/185.01, 185.02, 365/185.25; 257/48, 428

(56) References Cited

U.S. PATENT DOCUMENTS 5,959,309 A  *  9/1999  Tsui et al. ..................... 257/48
6,078,074 A  *  6/2000  Takebuchi et al. ........... 257/316
6,212,098 B1 *  4/2001  Yachareni et al. ...... 365/185.04
6,297,984 B1 * 10/2001  Roizin ......................... 365/106
6,329,691 B1 * 12/2001  Finzi ............................ 257/355

FOREIGN PATENT DOCUMENTS

JP          411233654 A   *  8/1999
JP         02000077537 A   *  3/2000
JP         020010606871    *  3/2001

* cited by examiner

Primary Examiner—Viet Q. Nguyen
(74) Attorney, Agent, or Firm—Nixon Peabody LLP; Donald R. Studebaker

(57) ABSTRACT

A nonvolatile semiconductor memory device includes memory cell, charge buildup damage reducer and damage reducer controller. The memory cell includes floating and control gates formed over a semiconductor substrate. The damage reducer is connected to the control gate. The controller is connected to the damage reducer. The damage reducer controls a potential level at the control gate so that the potential level falls within a predetermined voltage range even if charge buildup occurs in the control gate during a metallization process. And the controller allows no current to flow through the damage reducer while the memory cell is being written, read or erased.

11 Claims, 9 Drawing Sheets

NONVOLATILE SEMICONDUCTOR MEMORY DEVICE

BACKGROUND OF THE INVENTION

The present invention relates to a nonvolatile semiconductor memory device, and more particularly relates to a non-volatile semiconductor memory device including gate electrodes in two layers, i.e., control and floating gates, and functioning as a flash memory.

Memories so constructed as to erase specified data electrically at a time, like a flash memory, have been in higher and higher demand these days.

As is well known in the art, various factors make it difficult for a flash memory to ensure high reliability. A so-called "charge buildup damage" is one of those factors that decrease the reliability of a flash memory. The charge build-up damage is done on the tunnel insulating film of a flash memory during a metallization process to fabricate the memory. More specifically, when metal interconnects are formed by dry etching and patterning processes, positive or negative electric charges are likely accumulated in the interconnects. And if the quantity of those charges accumulated is huge, the control gate of the memory will have a potential with an outstandingly large absolute value, thus placing an excessively intense electric field on the tunnel insulating film. Should damage of that type be done on the tunnel insulating film, the reliability of a memory cell of the flash memory would decrease considerably.

For that reason, methods for reducing the charge buildup damage during a metallization process have been researched and developed vigorously in the pertinent art.

Hereinafter, one such method for reducing the charge buildup damage in a metallization process will be described.

FIG. 13 illustrates a memory cell for a flash memory (which will be herein called a "flash memory cell" simply) and a known charge buildup damage reducer. As shown in FIG. 13, a flash memory cell 101 has its control gate connected to a word line decoder 102 and to the cathode of a charge buildup damage reducer 103. The charge buildup damage reducer 103 is implemented as a backward diode with a grounded anode.

FIG. 14 illustrates a cross-sectional structure for the damage reducer 103. As shown in FIG. 14, a p-well 111 is defined in the upper part of a p-type semiconductor substrate 110. Over the p-well 111, n- and p-type doped regions 113 and 114 are defined and electrically isolated from each other by an isolation film 112. The n-type doped region 113 is connected to the control gate of the flash memory cell 101, while the p-well 111 and p-type substrate 110 are grounded by way of the p-type doped region 114.

FIG. 15 illustrates a current-voltage (I-V) characteristic of the damage reducer 103 (i.e., backward diode). In FIG. 15, the abscissa represents the voltage $V_{CG}$ applied to the control gate, while the ordinate represents the current $I_{diode}$ flowing from the n-type doped region 113 into the p-well 111 in the backward diode 103. As shown in FIG. 15, if the voltage $V_{CG}$ applied to the control gate is V11 (e.g., about −0.6 V) or less, a forward bias is applied to the backward diode 103. As a result, a current starts to flow through the backward diode 103. On the other hand, if the voltage $V_{CG}$ applied to the control gate is V12 (e.g., about 15 V) or more, breakdown occurs at the backward diode 103 and a current also starts to flow through the diode 103. That is to say, while the voltage $V_{CG}$ is between V11 (about −0.6 V) and V12 (about 15 V), no current flows through the backward diode 103.

Next, it will be described how the known charge buildup damage reducer operates.

In a gate grounded erase method, in which electrons are removed from the floating gate by applying 0 V and 12 V to the control gate and source electrode, respectively, during erasing, the voltage applied to the control gate is always between 0 V and 12 V irrespective of the mode of operation the flash memory cell. No current flows through the backward diode within this voltage range, and the operation of the flash memory cell is not interfered with.

On the other hand, during the metallization process, positive or negative electric charges build up in the control gate of a flash memory cell. However, the known charge build-up damage reducer 103, or the backward diode 103, is connected to the control gate of the flash memory cell 101. Accordingly, if the voltage applied to the control gate is V11 or less or V12 or more, the charges built up flow out of the control gate. In this manner, the damage done on the tunnel insulating film can be reduced and the considerable decrease in reliability of the flash memory is avoidable.

The known method of reducing the charge buildup damage in a metallization process, however, has the following two drawbacks.

Firstly, a negative voltage with a large absolute value cannot be applied to the control gate. As a flash memory cell has been downsized recently, it becomes more and more necessary to reduce the positive high voltage (e.g., about 12 V) applied to the source electrode during an erase operation. Various techniques of reducing the source voltage have been proposed. One of those methods is a gate negative voltage erase method as represented in the following Table 1:

TABLE 1

|  | Write | | Erase | | Read | |
| --- | --- | --- | --- | --- | --- | --- |
|  | Selected | Non-selected | Selected | Non-selected | Selected | Non-selected |
| Control gate | 12 V | 0 V | −8 V | 0 V | 5 V | 0 V |
| Drain | 5 V | Open | Open | Open | 1 V | Open |
| Source | 0 V | 0 V | 5 V | 0 V | 0 V | 0 V |
| p-well | 0 V | 0 V | 0 V | 0 V | 0 V | 0 V |

During a write operation, 12 V, 5 V, 0 V (i.e., ground potential) and 0 V are applied to the control gate, drain, source and p-well 111 of a selected flash memory cell, respectively. In this combination of applied voltages, channel hot electrons are created near the drain and are injected into the floating gate. After the write operation is over, the flash memory cell has a threshold voltage of about 6 V. As for non-selected flash memory cells on the other hand, 0 V is applied to the control gate thereof and the drain thereof is opened, thereby preventing those cells from being written erroneously.

During an erase operation, −8 V, 5 V and 0 V are applied to the control gate, source and p-well 111 of the selected flash memory cell and the drain thereof is opened. In this combination of applied voltages, a Fowler-Nordheim (FN) tunneling current flows from the floating gate into the source and the electrons are removed from the floating gate. After the erase operation is over, the flash memory cell has a threshold voltage of about 2 V. As for the non-selected flash memory cells on the other hand, 0 V is applied to the control gate and source thereof, thereby preventing those cells from being erased erroneously.

During a read operation, 5 V, 1 V, 0 V and 0 V are applied to the control gate, drain, source and p-well 111 of the selected flash memory cell, respectively. In this combination of applied voltages, where the memory cell selected has been erased, a current flows from the drain toward the source thereof. On the other hand, if the selected cell has been written, no current flows through the cell. Accordingly, by sensing a difference in the amount of current flowing from the drain to the source thereof, it is possible to determine whether the memory cell has been erased or written. As for non-selected flash memory cells on the other hand, the ground potential is applied to the control gate thereof and the drain thereof is opened, thereby preventing those cells from being read erroneously.

However, the known charge buildup damage reducer for metallization process is not applicable to a flash memory cell to which this gate negative voltage erase method is supposed to be applied. This is because the negative voltage of −8 V applied to the control gate thereof during the erase operation belongs to the voltage range in which the backward diode is forward biased, and cannot be applied to the control gate even when the damage reducer is used.

Secondly, the decrease in reliability of a flash memory cell is not completely avoidable because a positive high voltage of about 15 V might be applied to the control gate during a metallization process. Specifically, the known charge buildup damage reducer uses a backward diode, so a voltage between V11 (about −0.6 V) and V12 (about 15 V) may be applied to the control gate. This voltage of about 15 V does not degrade the reliability of the flash memory so seriously but is so high as to allow a large FN tunneling current to flow through the tunnel insulating film thereof. Accordingly, the flash memory might have its reliability affected non-negligibly.

For these reasons, the known charge buildup damage reducing method for metallization process is not applicable to a flash memory utilizing the gate negative voltage erase method. Also, even if that damage reducing method is applied to a cell utilizing the erase method, the two problems mentioned above should occur and the charge buildup damage could not be reduced sufficiently during the metallization process.

SUMMARY OF THE INVENTION

It is therefore an object of the present invention to provide a nonvolatile semiconductor memory device to which the gate negative voltage erase method and the charge buildup damage reducing method for metallization process are both applicable effectively.

To achieve this object, while a memory cell is operating, the damage reducer, which is a type of electrostatic discharge (ESD) shielding so to speak, is disabled according to the present invention.

Specifically, an inventive nonvolatile semiconductor memory device includes memory cell, charge buildup damage reducer and damage reducer control means. The memory cell includes floating and control gates formed over a semiconductor substrate. The damage reducer is connected to the control gate. And the control means is connected to the damage reducer. The damage reducer controls a potential level at the control gate so that the potential level falls within a predetermined voltage range even if charge buildup occurs in the control gate during a metallization process. And the control means allows no current to flow through the damage reducer while the memory cell is being written, read or erased.

The inventive memory device can adopt the gate negative voltage erase method and yet can reduce the charge buildup damage during a metallization process. Accordingly, the memory cell can operate at a reduced voltage.

In one embodiment of the present invention, the damage reducer is preferably a diode that includes first and second electrodes. The first electrode of the diode is preferably connected to the control gate. And the control means is preferably connected to the second electrode of the diode and preferably changes a voltage applied to the second electrode of the diode depending on whether the memory cell is being written, read or erased.

In this particular embodiment, the diode preferably includes: a well of a first conductivity type, which is formed in the substrate and used as the second electrode; and a doped region of a second conductivity type, which is defined in the well and used as the first electrode.

More particularly, the first and second conductivity types may be n- and p-types, respectively. And the control means may set the potential level at the n-well to a value equal to or greater than each voltage applied to the control gate while the memory cell is being written, read or erased.

In such an embodiment, the diode is connected in the forward direction. Accordingly, while the diode is reverse biased with respect to the control gate, no current flows through the diode and the device is compatible with the gate negative voltage erase method. Also, during a write operation, for example, a positive bias is applied to the control gate. However, since the control means sets the potential level at the n-well to a value equal to or greater than the positive bias, no forward current flows through the diode. Accordingly, the write operation can be performed just as intended.

Alternatively, the first and second conductivity types may also be p- and n-types, respectively. And the control means may set the potential level at the p-well to a value equal to or smaller than each voltage applied to the control gate while the memory cell is being written, read or erased.

In such an embodiment, the diode is connected in the backward direction. Accordingly, while the diode is forward biased with respect to the control gate, no current flows through the diode and the device can cope with the write and read operations as it is. Also, during an erase operation, a negative bias is applied to the control gate. However, since the control means sets the potential level at the p-well to a value equal to or smaller than the negative bias, no forward current flows through the diode. Accordingly, the erase operation can be performed just as intended.

In still another embodiment, the potential level at the control gate during the metallization process is preferably controlled to fall within a voltage range in which neither forward nor back current flows through the diode.

In yet another embodiment, the device preferably further includes a multi-level interconnect structure formed over the substrate to have two or more interconnect layers. The control gate and the diode are preferably connected together via one of the interconnect layers that is closer to the substrate than any other interconnect layer in the interconnect structure.

Then, the charge buildup damage can be reduced in every interconnect layer of the multi-level interconnect structure, as well as in the first-level interconnect layer.

In yet another embodiment, the damage reducer may include first and second diodes formed in the substrate. Each diode includes two electrodes with mutually opposite polarities. One of the two electrodes of the first diode and one of the two electrodes of the second diode may be both connected to the control gate. Then, the control means preferably changes a voltage applied to the other electrode of the first diode and the other electrode of the second diode depending on whether the memory cell is being written, read or erased.

In this particular embodiment, the first diode preferably includes a first well of a first conductivity type and a first doped region of a second conductivity type. The first well is formed in the substrate and used as the second electrode of the first diode. The first doped region is defined in the first well and used as the first electrode of the first diode. The second diode preferably includes a second well of the second conductivity type and a second doped region of the first conductivity type. The second well is formed in the substrate and used as the second electrode of the second diode. And the second doped region is defined in the second well and used as the first electrode of the second diode.

More particularly, the first and second conductivity types are preferably n- and p-types, respectively. The control means preferably sets the potential level at the n-well of the first diode to a value equal to or greater than each voltage applied to the control gate while the memory cell is being written, read or erased. Also, the control means preferably sets the potential level at the p-well of the second diode to a value equal to or smaller than each said voltage applied to the control gate while the memory cell is being written, read or erased.

In such an embodiment, the first and second diodes are connected in forward and backward directions, respectively. Accordingly, if positive charges build up during a metallization process, then the first diode is forward biased and the charges accumulated easily flow out therefrom. On the other hand, if negative charges build up during the metallization process, then the second diode is forward biased and the charges accumulated also flow out easily therefrom. Thus, the damage usually done on the tunnel insulating film can be eliminated almost completely. In addition, during a write or read operation in which the control gate is forward biased, the control means sets the potential level at the n-well of the first diode to a value equal to or greater than the positive bias. Accordingly, no forward current flows through the first diode. On the other hand, during an erase operation in which the control gate is reverse biased, the control means sets the potential level at the p-well of the second diode to a value equal to or smaller than the negative bias. Accordingly, no forward current flows through the second diode. In this manner, the memory cell can be written, read or erased just as intended.

In still another embodiment, the potential level at the control gate during the metallization process is preferably controlled to fall within a voltage range in which no forward current flows through the first or second diode.

In yet another embodiment, the inventive device preferably further includes a multi-level interconnect structure formed over the substrate to include two or more interconnect layers. The control gate is preferably connected to the first and second diodes via one of the interconnect layers that is closer to the substrate than any other interconnect layer in the interconnect structure.

DESCRIPTION OF THE PREFERRED EMBODIMENTS

Embodiment 1

Hereinafter, a first embodiment of the present invention will be described with reference to the drawings.

Figure 1:
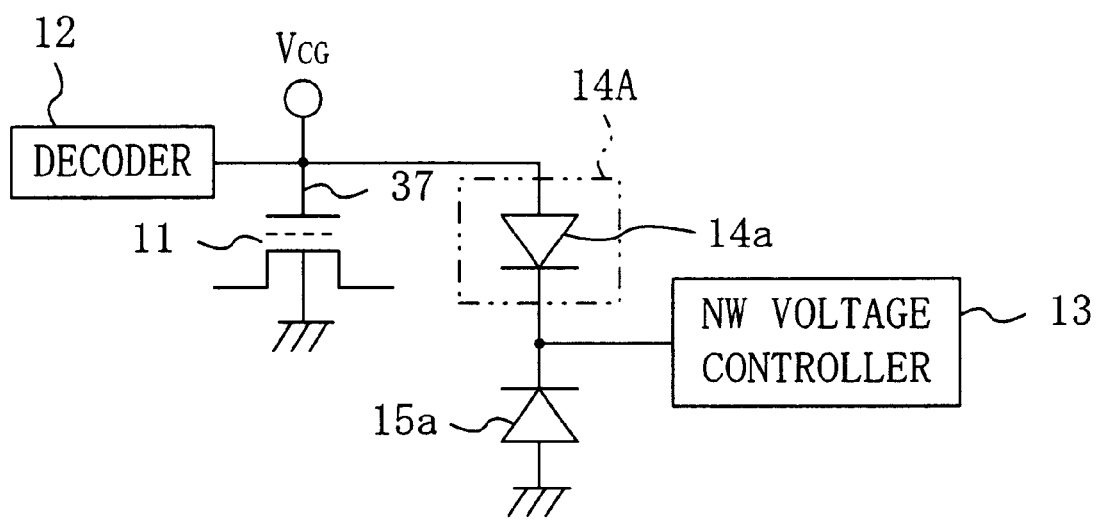
FIG. 1 is a block diagram illustrating a schematic configuration for a nonvolatile semiconductor memory device according to a first embodiment of the present invention.

FIG. 1 illustrates a schematic configuration for a nonvolatile semiconductor memory device according to the first embodiment. As shown in FIG. 1, the control gate 37 of a flash memory cell 11 is connected to a word line decoder 12 and to a charge buildup damage reducer 14A.

The damage reducer 14A includes a forward diode 14a. The diode 14a has its anode connected to the control gate 37 of the memory cell 11 and its cathode connected to an NW voltage controller 13, which is an exemplary damage reducer control means as defined in the appended claims. The diode 14a has its cathode also connected to the cathode of a backward diode 15a whose anode is grounded. In this case, the memory cell 11 is one of a great number of memory cells arranged in columns and rows to form an array.

Figure 2A:
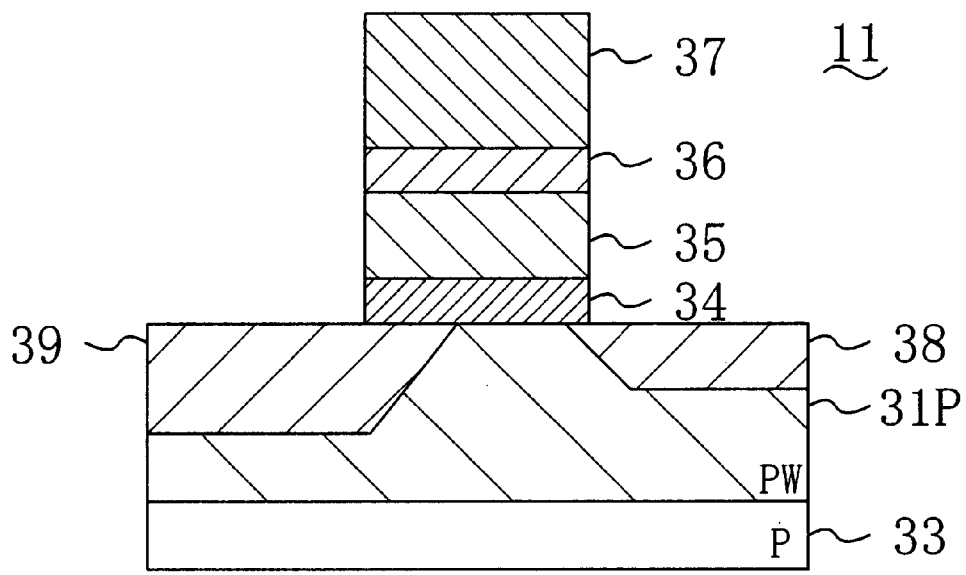
FIGS. 2A and 2B are cross-sectional views illustrating a flash memory cell and a charge buildup damage reducer, respectively, according to the first embodiment.

FIG. 2A illustrates a cross-sectional structure for the memory cell 11. As shown in FIG. 2A, a tunnel insulating film 34 is formed as a thermal oxide film on the principal surface of a semiconductor substrate 33 of p-type silicon. A p-well 31P is defined in the upper part of the substrate 33. And on the tunnel insulating film 34, floating gate 35 of polysilicon, capacitive insulating film 36 of silicon dioxide and control gate 37 of polysilicon are stacked one upon the other in this order.

In upper parts of the p-well 31P, n-type source/drain regions 39 and 38 are defined so as to interpose the gate structure between them in the gate length direction. In the illustrated embodiment, the n-type source region 39 is formed to have a greater diffusion depth than the n-type drain region 38. In addition, as viewed from over the device, the n-type source region 39 overlaps with the floating gate 35 in a broader area than the n-type drain region 38 does.

Figure 2B:
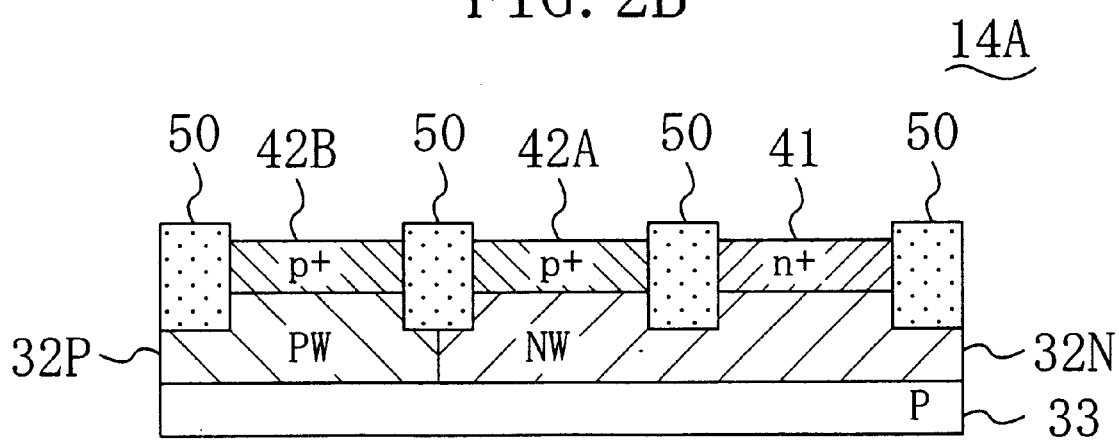

FIG. 2B illustrates a cross-sectional structure for the damage reducer 14A. As shown in FIG. 2B, n- and p-wells 32N and 32P are defined in two other regions of the substrate 33 shown in FIG. 2A so that a pn junction is formed between these wells 32N and 32P.

In the upper part of the n-weil 32N, an n-type doped region 41 and a first p-type doped region 42A are defined so as to be electrically isolated from each other by an isolation film 50 of an insulator. The first p-type doped region 42A is connected to the control gate 37 of the flash memory cell 11 shown in FIG. 1.

Also, the n-well 32N is connected to the NW voltage controller 13 shown in FIG. 1 by way of the n-type doped region 41. A predetermined voltage is applied from the NW voltage controller 13 to the n-well 32N so that no current flows through the forward diode 14a, made up of the first p-type doped region 42A and n-well 32N, depending on a state in which the flash memory cell 11 is driven.

The p-well 32P and substrate 33 are grounded by way of a second p-type doped region 42B defined in the upper part of the p-well 32P. The backward diode 15a shown in FIG. 1 is made up of the n-well 32N and substrate 33.

As described above, in the memory device of the first embodiment, the forward diode 14a is used as the damage reducer 14A. In addition, the NW voltage controller 13 controls the potential level at the n-well 32N for the forward diode 14a depending on a state in which the flash memory cell 11 is driven.

Figure 3:
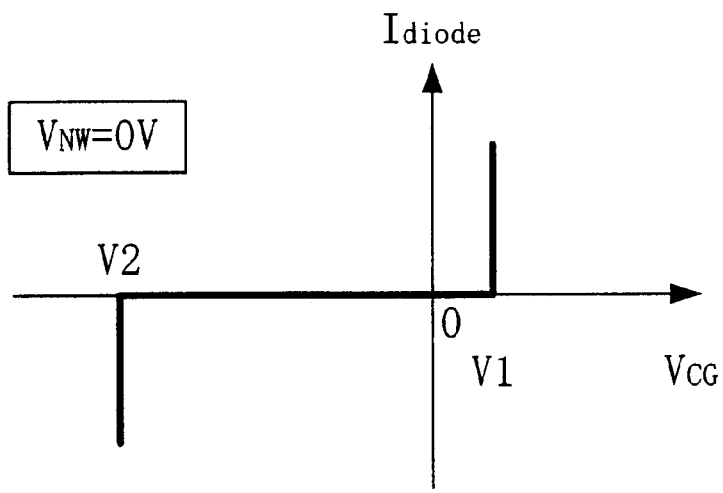
FIG. 3 is a graph illustrating an I-V characteristic of the damage reducer of the first embodiment where a control voltage of 0 V is applied to the n-well.

FIG. 3 illustrates an I-V characteristic of the damage reducer 14A (i.e., the forward diode 14a) where the potential level $V_{NW}$ at the n-well 32N is fixed at 0 V. In FIG. 3, the abscissa represents the voltage $V_{CG}$ applied to the control gate 37, while the ordinate represents the current $I_{diode}$ flowing from the p-type doped region 42A into the n-well 32N in the forward diode 14a.

In the situation shown in FIG. 3 where the potential level $V_{NW}$ at the n-well 32N is fixed at 0 V, if the voltage $V_{CG}$ applied to the control gate 37 is V1 (about 0.6 V) or more, the forward diode 14a is forward biased and a forward current flows therethrough. Also, if the voltage $V_{CG}$ applied to the control gate 37 is V2 (about −15 V) or less, breakdown occurs in the forward diode 14a and a back current flows therethrough. That is to say, at the potential level $V_{NW}$ of 0 V for the n-well 32N, while the voltage $V_{CG}$ applied to the control gate 37 is between V2 (about −15 V) and V1 (about 0.6 V), no current flows through the forward diode 14a.

Figure 4:
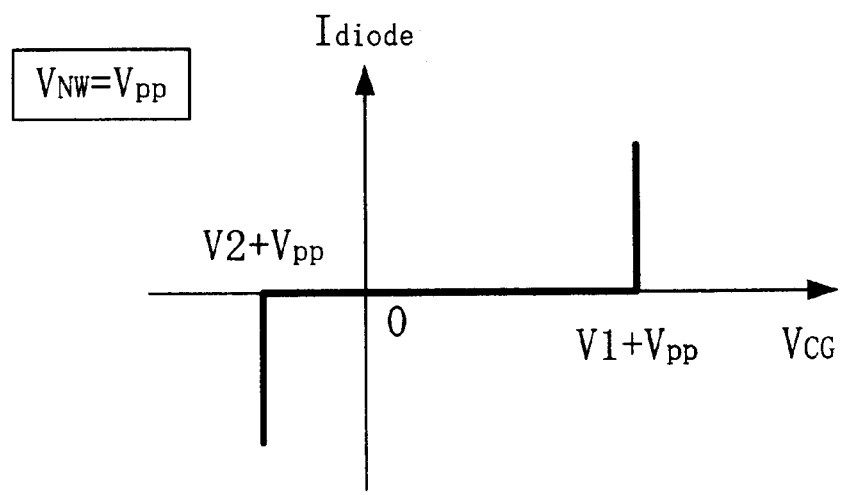
FIG. 4 is a graph illustrating another I-V characteristic of the damage reducer of the first embodiment where a control voltage $V_{pp}$ is applied to the n-well.

FIG. 4 illustrates an I-V characteristic of the forward diode 14a where the potential level $V_{NW}$ at the n-well 32N is set equal to the control voltage $V_{PP}$. In the situation shown in FIG. 4 where the potential level $V_{NW}$ at the n-well 32N is set equal to the control voltage $V_{PP}$, if the voltage $V_{CG}$ applied to the control gate 37 is V1+$V_{PP}$ or more, the forward diode 14a is forward biased and a forward current flows therethrough. Also, if the voltage $V_{CG}$ applied to the control gate 37 is V2+$V_{PP}$ or less, breakdown occurs in the forward diode 14a and a back current flows therethrough. That is to say, at the potential level $V_{NW}$ equal to the control voltage $V_{PP}$ for the n-well 32N, while the voltage $V_{CG}$ applied to the control gate 37 is between V2+$V_{PP}$ and V1+$V_{PP}$, no current flows through the forward diode 14a. For example, if the control voltage $V_{PP}$ is 12 V, no current flows through the forward diode 14a while the voltage $V_{CG}$ applied to the control gate 37 is in the range from −3V and +12.6 V.

Hereinafter, it will be described how the memory device and NW voltage controller 13 of the first embodiment operate. In the following illustrative example, the gate negative voltage erase method is applied to the memory device in question.

To realize the same operation as that defined by the gate negative voltage erase method shown in Table 1, specific values of the control voltages $V_{PP}$ output from the NW voltage controller 13 are shown in the following Table 2:

TABLE 2

| | Write | | Erase | | Read | |
|---|---|---|---|---|---|---|
| | Selected | Non-selected | Selected | Non-selected | Selected | Non-selected |
| Control gate 37 | 12 V | 0 V | −8 V | 0 V | 5 V | 0 V |
| Drain 38 | 5 V | Open | Open | Open | 1 V | Open |
| Source 39 | 0 V | 0 V | 5 V | 0 V | 0 V | 0 V |
| p-well 31P | 0 V | 0 V | 0 V | 0 V | 0 V | 0 V |
| Vpp | 12 V | | 0 V | | 5 V | |
| Vee | 0 V | | −8 V | | 0 V | |

As shown in Table 2, the voltage $V_{CG}$ applied to the control gates 37 during a write operation is from 0 V through 12 V. To allow no current to flow through the forward diode 14a in this applied voltage range, the control voltage $V_{PP}$ may be set to 12 V. In that case, no current flows through the damage reducer 14A unless the charges build up to a predetermined quantity or more in the control gate 37 during dry etching in the fabrication process and then flow into the substrate or flow out. Accordingly, no charges will leak out of the control gate 37 to interfere with the normal operation of the memory device.

The voltage $V_{CG}$ applied to the control gate 37 during an erase operation is from −8 V through 0 V. To allow no current to flow through the forward diode 14a in this applied voltage range, the control voltage $V_{PP}$ may be set to 0 V.

The voltage $V_{CG}$ applied to the control gate 37 during a read operation is from 0 V through 5 V. To allow no current to flow through the forward diode 14a in this applied voltage range, the control voltage $V_{PP}$ may be set to 5 V.

During a metallization process on the other hand, the control voltage $V_{PP}$ is approximately 0 V. In that case, the voltage $V_{CG}$ applied to the control gate 37 is limited to the range from V2 (about −15 V) to V1 (about 0.6 V). Accordingly, no charge buildup will occur in the control gate 37 and the considerable decrease in reliability of the memory cell is avoidable.

As described above, according to the first embodiment, the forward diode 14a is used as the damage reducer 14A and the potential level $V_{NW}$ of the n-well 32N for the forward diode 14a is changed in accordance with a state in which the flash memory cell 11 is driven. Thus, the gate negative voltage erase method is applicable to the damage reducer 14A. As a result, the memory cell can operate at a lower voltage and the charge buildup damage, which is usually done on the tunnel insulating film 34 during a metallization process, can be reduced.

Embodiment 2

Hereinafter, a second embodiment of the present invention will be described with reference to the drawings.

A nonvolatile semiconductor memory device according to the second embodiment uses a backward diode as a charge buildup damage reducer and the potential level at a p-well for the backward diode is changed depending on a state in which the flash memory cell is driven.

Figure 5:
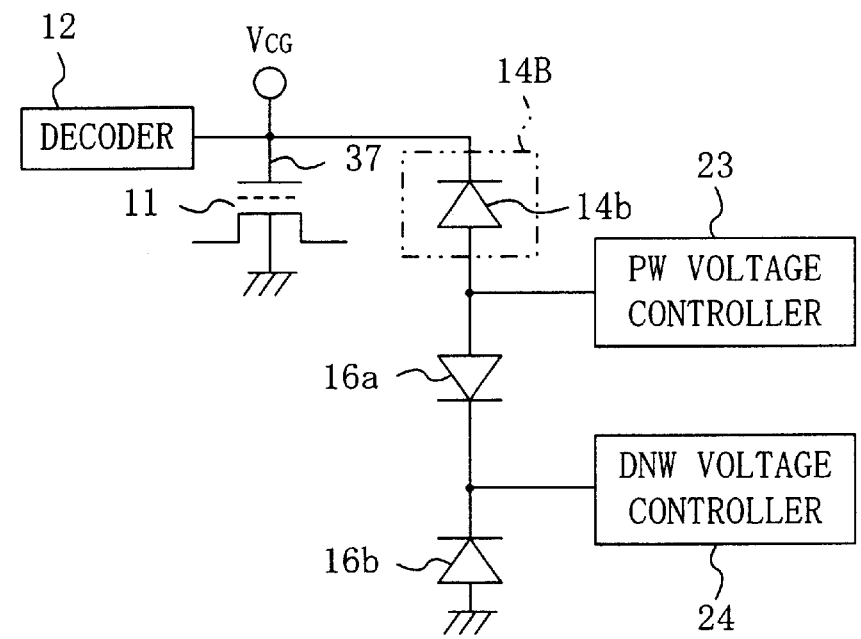
FIG. 5 is a block diagram illustrating a schematic configuration for a nonvolatile semiconductor memory device according to a second embodiment of the present invention.

FIG. 5 illustrates a schematic configuration for the memory device of the second embodiment. As shown in FIG. 5, the control gate 37 of the flash memory cell 11 is connected to the word line decoder 12 and a charge buildup damage reducer 14B.

The damage reducer 14B includes a backward diode 14b. The backward diode 14b has its cathode connected to the control gate 37 of the memory cell 11 and its anode connected to a PW voltage controller 23, which is an exemplary damage reducer control means as defined in the appended claims. The backward diode 14b has its anode also connected to the anode of a forward diode 16a. The forward diode 16a has its cathode connected to the cathode of another backward diode 16b whose anode is grounded. Also, the common cathode of the forward and backward diodes 16a and 16b is connected to a DNW voltage controller 24 as another exemplary damage reducer control means.

In this case, the memory cell 11 is one of a great number of memory cells arranged in columns and rows to form an array. Also, the memory cell 11 has the same structure as that shown in FIG. 2A.

Figure 6:
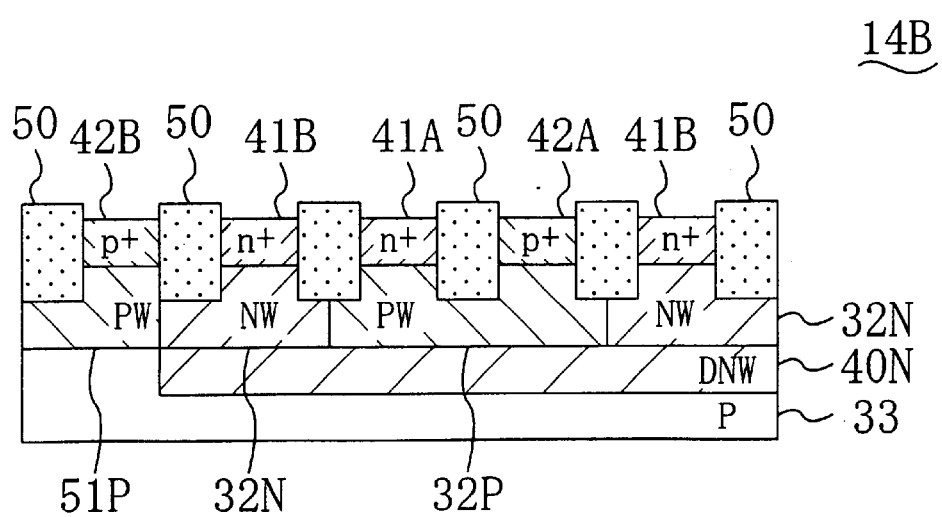
FIG. 6 is a cross-sectional view illustrating a charge buildup damage reducer according to the second embodiment.

FIG. 6 illustrates a cross-sectional structure for the damage reducer 14B. As shown in FIG. 6, a deep n-well 40N is defined in part of the p-type silicon substrate 33 in which a diode is formed for the damage reducer 14B. Over the deep n-well 40N, a p-well 32P is defined and an n-well 32N is also defined to form a pn junction surrounding the p-well 32P.

In the upper part of the p-well 32P, a first n-type doped region 41A and a first p-type doped region 42A are defined so as to be electrically isolated from each other by an isolation film 50 of an insulator. The first n-type doped region 41A is connected to the control gate 37 of the flash memory cell 11 shown in FIG. 5.

Also, the p-well 32P is connected to the PW voltage controller 23 shown in FIG. 5 by way of the first p-type doped region 42A. A predetermined voltage is applied from the PW voltage controller 23 to the p-well 32P so that no current flows through the backward diode 14b, made up of the first n-type doped region 41A and p-well 32P, depending on a state in which the flash memory cell 11 is driven.

The p-well 32P is electrically isolated by the n-well 32N and deep n-well 40N from another p-well 51 and substrate 33, respectively. Also, a predetermined voltage is applied from the DNW voltage controller 24 to the n-well 32N and deep n-well 40N by way of the second n-type doped region 41B over the n-well 32N so that the potential level at the n-well 32N and deep n-well 40N becomes higher or lower than that of the p-well 32P depending on a state in which the memory cell 11 is driven. Furthermore, the substrate 33 is grounded by way of a second p-type doped region 42B over the p-well 51P.

The forward diode 16a shown in FIG. 5 is made up of the p-well 32P and deep n-well 40N. On the other hand, the backward diode 16b shown in FIG. 5 is made up of the deep n-well 40N and p-type substrate 33.

Figure 7:
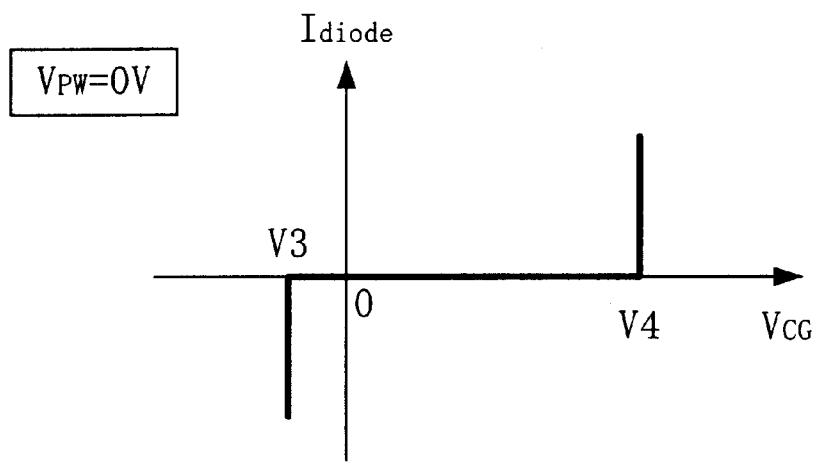
FIG. 7 is a graph illustrating an I-V characteristic of the damage reducer of the second embodiment where a control voltage of 0 V is applied to the p-well.

FIG. 7 illustrates an I-V characteristic of the damage reducer 14B (i.e., the backward diode 14b) where the potential level $V_{PW}$ at the p-well 32P shown in FIG. 6 is fixed at 0 V. In FIG. 7, the abscissa represents the voltage $V_{CG}$ applied to the control gate 37, while the ordinate represents the current $I_{diode}$ flowing from the n-type doped region 41A into the p-well 32P in the backward diode 14b.

In the situation shown in FIG. 7 where the PW voltage controller 23 fixes the potential level $V_{PW}$ at the p-well 32P shown in FIG. 6 at 0 V by way of the first p-type doped region 42A, if the voltage $V_{CG}$ applied to the control gate 37 is V3 (about –0.6 V) or less, then the backward diode 14b is forward biased and a forward current flows therethrough. Also, if the voltage $V_{CG}$ applied to the control gate 37 is V4 (about 15 V) or more, breakdown occurs in the backward diode 14b and a back current flows therethrough. That is to say, at the potential level $V_{PW}$ of 0 V for the p-well 32P, while the voltage $V_{CG}$ applied to the control gate 37 is between V3 (about –0.6 V) and V4 (about 15 V), no current flows through the backward diode 14b.

Figure 8:
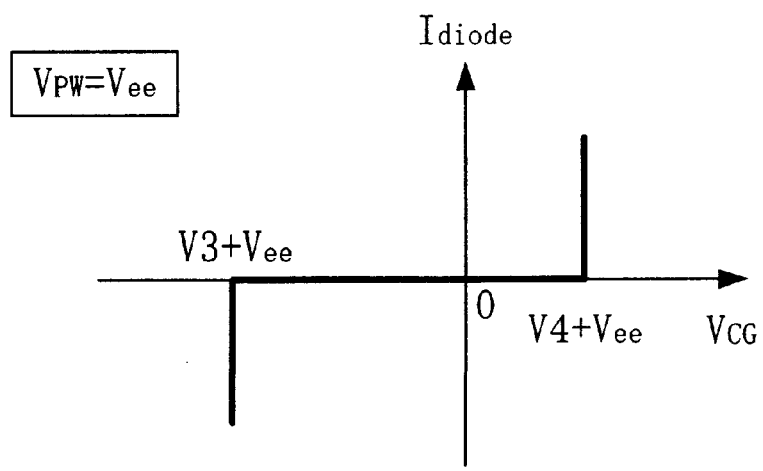
FIG. 8 is a graph illustrating another I-V characteristic of the damage reducer of the second embodiment where a control voltage $V_{ee}$ is applied to the p-well.

FIG. 8 illustrates an I-V characteristic of the backward diode 14b where the PW voltage controller 23 sets the potential level $V_{PW}$ at the p-well 32P equal to the control voltage $V_{ee}$ by way of the first p-type doped region 42A. In the situation shown in FIG. 8 where the potential level $V_{PW}$ at the p-well 32P is set equal to the control voltage $V_{ee}$, if the voltage $V_{CG}$ applied to the control gate 37 is V3+$V_{ee}$ or less, then the backward diode 14b is forward biased and a forward current flows therethrough. Also, if the voltage $V_{CG}$ applied to the control gate 37 is V4+$V_{ee}$ or more, breakdown occurs in the backward diode 14b and a back current flows therethrough. That is to say, at the potential level $V_{PW}$ equal to the control voltage $V_{ee}$ for the p-well 32P, while the voltage $V_{CG}$ applied to the control gate 37 is between V3+$V_{ee}$ and V4+$V_{ee}$, no current flows through the backward diode 14b. For example, if the control voltage $V_{ee}$ is –8 V, no current flows through the backward diode 14b where the voltage $V_{CG}$ applied to the control gate 37 is from –8.6 V through +7 V.

Hereinafter, it will be described how the memory device and PW voltage controller of the second embodiment operate. In the following illustrative example, the gate negative voltage erase method is applied to the memory device in question.

To realize the same operation as that defined by the gate negative voltage erase method shown in Table 1, specific values of the control voltages $V_{ee}$ output from the PW voltage controller 23 are also shown in Table 2.

As shown in Table 2, the voltage $V_{CG}$ applied to the control gate 37 during a write operation is from 0 V through 12 V. To allow no current to flow through the backward diode 14b in this applied voltage range, the control voltage $V_{ee}$ may be set to 0 V. In that case, no current flows through the damage reducer 14B unless the charges build up to a predetermined quantity or more in the control gate 37 during dry etching in the fabrication process. Accordingly, no charges will leak out of the control gate 37 to interfere with the normal operation of the memory device.

The voltage $V_{CG}$ applied to the control gate 37 during an erase operation is from –8 V through 0 V. To allow no current to flow through the backward diode 14b in this applied voltage range, the control voltage $V_{ee}$ may be set to –8 V.

The voltage $V_{CG}$ applied to the control gate 37 during a read operation is from 0 V through 5 V. To allow no current to flow through the backward diode 14b in this applied voltage range, the control voltage $V_{ee}$ may be set to 0 V.

It should be noted that the potential level at the n-well 32N may be set at any value higher than that of the p-well 32P. For example, the n-well 32N may have a potential level of 5 V during each of read, write and erase operations.

During a metallization process on the other hand, the control voltage $V_{ee}$ is approximately 0 V. In that case, the voltage $V_{CG}$ applied to the control gate 37 is limited to the range from V3 (about –0.6 V) to V4 (about 15 V). Accordingly, no charge buildup will occur at the control gate 37 and the considerable decrease in reliability of the memory cell is avoidable.

As described above, in the second embodiment, the backward diode 14b is used as the damage reducer 14B and the potential level $V_{PW}$ at the p-well 32P for the backward diode 14b is changed in accordance with a state in which the flash memory cell 11 is driven. Thus, the gate negative voltage erase method is applicable to the damage reducer 14B.

Embodiment 3

Hereinafter, a third embodiment of the present invention will be described with reference to the drawings.

A nonvolatile semiconductor memory device according to the third embodiment uses forward and backward diodes (which will be herein called "twin diodes") as a charge buildup damage reducer. Also, in the device of the third embodiment, potential levels at n- and p-wells for the forward and backward diodes, respectively, are changed depending on a state in which the flash memory cell is driven.

Figure 9:
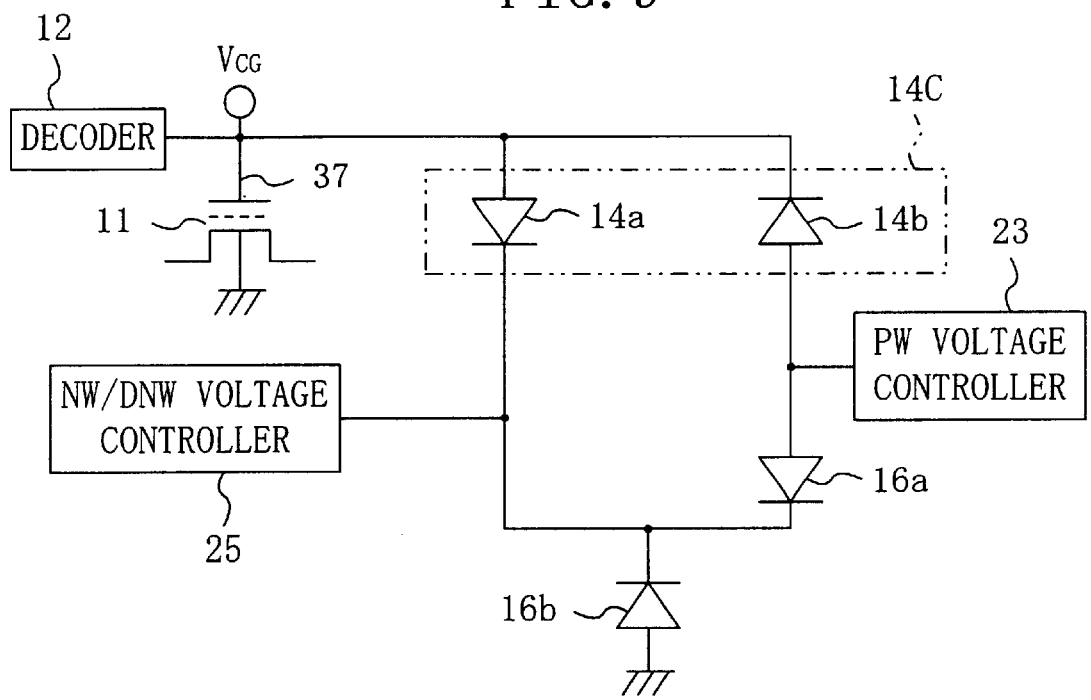
FIG. 9 is a block diagram illustrating a schematic configuration for a nonvolatile semiconductor memory device according to a third embodiment of the present invention.

FIG. 9 illustrates a schematic configuration for the memory device of the third embodiment. As shown in FIG. 9, the control gate 37 of the flash memory cell 11 is connected to the word line decoder 12 and a charge buildup damage reducer 14C.

The damage reducer 14C includes forward and backward diodes 14a and 14b. The forward diode 14a has its anode connected to the control gate 37 of the memory cell 11 and its cathode connected to an NW/DNW voltage controller 25, which is an exemplary damage reducer control means as defined in the appended claims. The backward diode 14b has its cathode connected to the control gate 37 of the memory cell 11 and its anode connected to a PW voltage controller 23, which is another exemplary damage reducer control means as defined in the claims.

The forward diode 14a has its cathode connected to the cathode of another backward diode 16b whose anode is grounded.

The backward diode 14b has its anode connected to the anode of another forward diode 16a whose cathode is connected to the cathode of the backward diode 16b.

In this case, the memory cell 11 is one of a great number of memory cells arranged in columns and rows to form an array. Also, the flash memory cell 11 has the same structure as that shown in FIG. 2A.

Figure 10:
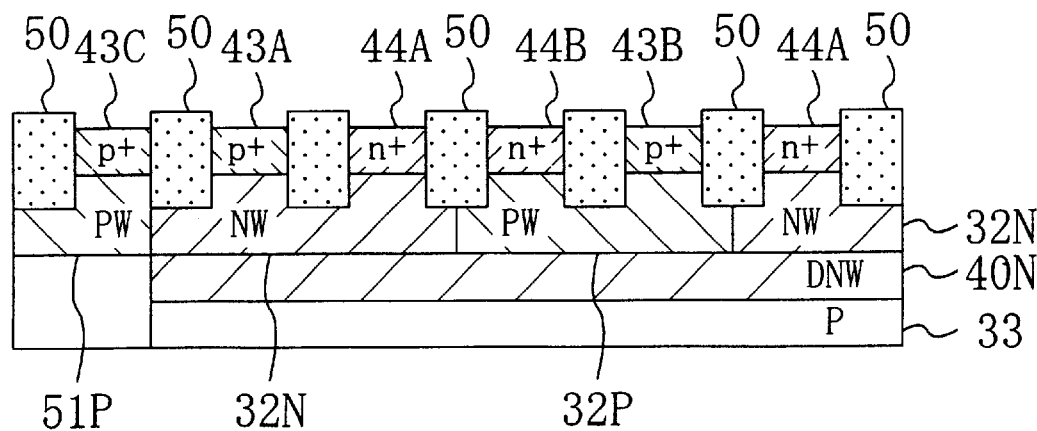
FIG. 10 is a cross-sectional view illustrating a charge buildup damage reducer according to the third embodiment.

FIG. 10 illustrates a cross-sectional structure for the damage reducer 14C. As shown in FIG. 10, a deep n-well 40N is defined in part of the p-type silicon substrate 33 in which diodes are formed for the damage reducer 14C. Over the deep n-well 40N, a p-well 32P is defined and an n-well 32N is also defined to form a pn junction surrounding the p-well 32P.

In the upper part of the n-well 32N, a first p-type doped region 43A and a first n-type doped region 44A are defined and electrically isolated from each other by an isolation film 50 of an insulator.

In the upper part of the p-well 32P, a second n-type doped region 44B and a second p-type doped region 43B are defined and electrically isolated from each other by the isolation film 50.

The first p-type doped region 43A of the n-well 32N and the second n-type doped region 44B of the p-well 32P are connected to the control gate 37 of the flash memory cell 11 shown in FIG. 9.

The n-well 32N is connected to the NW/DNW voltage controller 25 shown in FIG. 9 by way of the first n-type doped region 44A. A first control voltage with a predetermined potential level is applied from the NW/DNW voltage controller 25 the n-well 32N so that no current flows through the forward diode 14a, made up of the first p-type doped region 43A and n-well 32N, depending on a state in which the memory cell 11 is driven.

Also, the p-well 32P is connected to the PW voltage controller 23 shown in FIG. 9 by way of the second p-type doped region 43B. A second control voltage with a predetermined potential level is applied from the PW voltage controller 23 to the p-well 32P so that no current flows through the backward diode 14b, made up of the second n-type doped region 44B and p-well 32P, depending on a state in which the memory cell 11 is driven.

The p-well 32P is electrically isolated by the n-well 32N and deep n-well 40N from another p-well 51P and p-type substrate 33, respectively. Also, the substrate 33 is grounded by way of a third p-type doped region 43C defined over the p-well 51P.

The forward diode 16a shown in FIG. 9 is made up of the p-well 32P and deep n- well 40N. On the other hand, the backward diode 16b shown in FIG. 9 is made up of the deep n-well 40N and p-type substrate 33.

Figure 11:
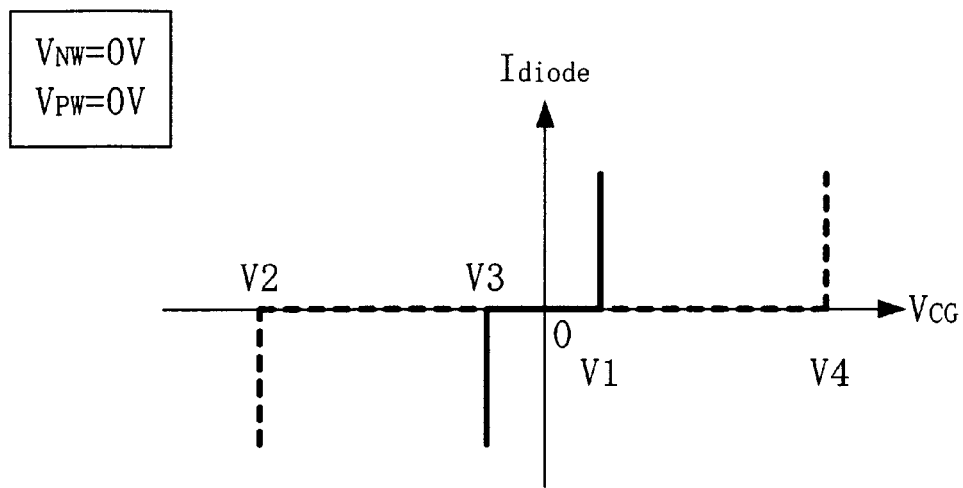
FIG. 11 is a graph illustrating I-V characteristics of the damage reducer of the third embodiment where a control voltage of 0 V is applied to the n- and p-wells.

FIG. 11 illustrates I-V characteristics of the damage reducer 14C (i.e., the twin diodes) where the potential levels $V_{NW}$ and $V_{PW}$ at the n- and p-wells 32N and 32P are both fixed at 0 V. In FIG. 11, the abscissa represents the voltage $V_{CG}$ applied to the control gate 37, while the ordinate represents the current $I_{diode}$ flowing through the twin diodes.

In the situation shown in FIG. 11 where the potential levels $V_{NW}$ and $V_{PW}$ at the n- and p-wells 32N and 32P are both fixed at 0 V, if the voltage $V_{CG}$ applied to the control gate 37 is V3 (about –0.6 V) or less, then the backward diode 14b is forward biased and a forward current flows therethrough. Also, if the voltage $V_{CG}$ applied to the control gate 37 is V1 (about 0.6 V) or more, then the forward diode 14a is forward biased and a forward current flows therethrough. That is to say, where the potential levels $V_{PW}$ and $V_{NW}$ at the p- and n-wells 32P and 32N are both 0 V, if the voltage $V_{CG}$ applied to the control gate 37 is between V3 (about –0.6 V) and V1 (about 0.6 V), no current flows through the twin diodes.

Figure 12:
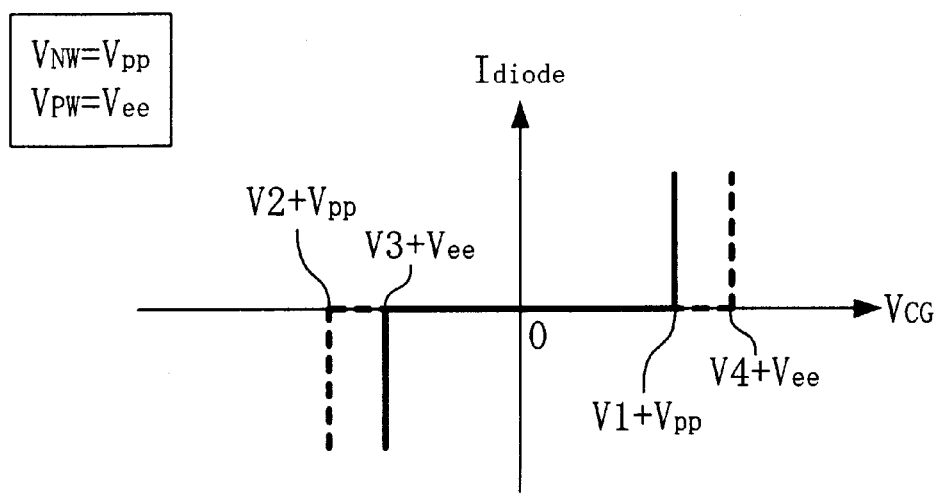
FIG. 12 is a graph illustrating I-V characteristics of the damage reducer of the third embodiment where first and second control voltages $V_{PP}$ and $V_{ee}$ are applied to the n- and p-wells, respectively.
Figure 13:
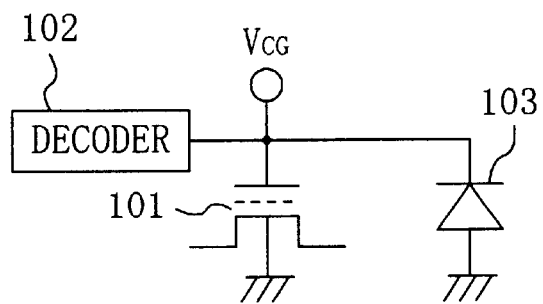
FIG. 13 is a block diagram illustrating a schematic configuration for a known nonvolatile semiconductor memory device.
Figure 14:
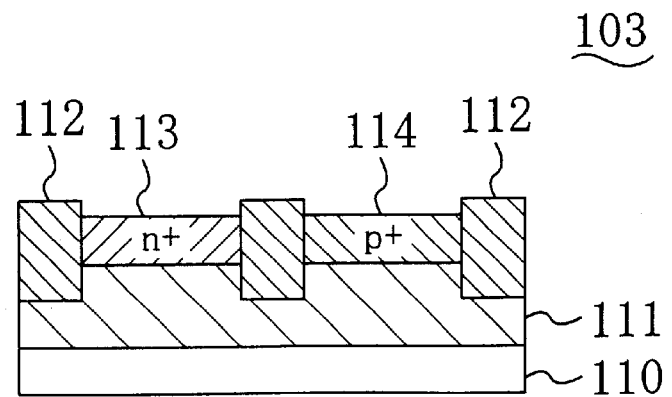
FIG. 14 is a cross-sectional view illustrating a known charge buildup damage reducer.
Figure 15:
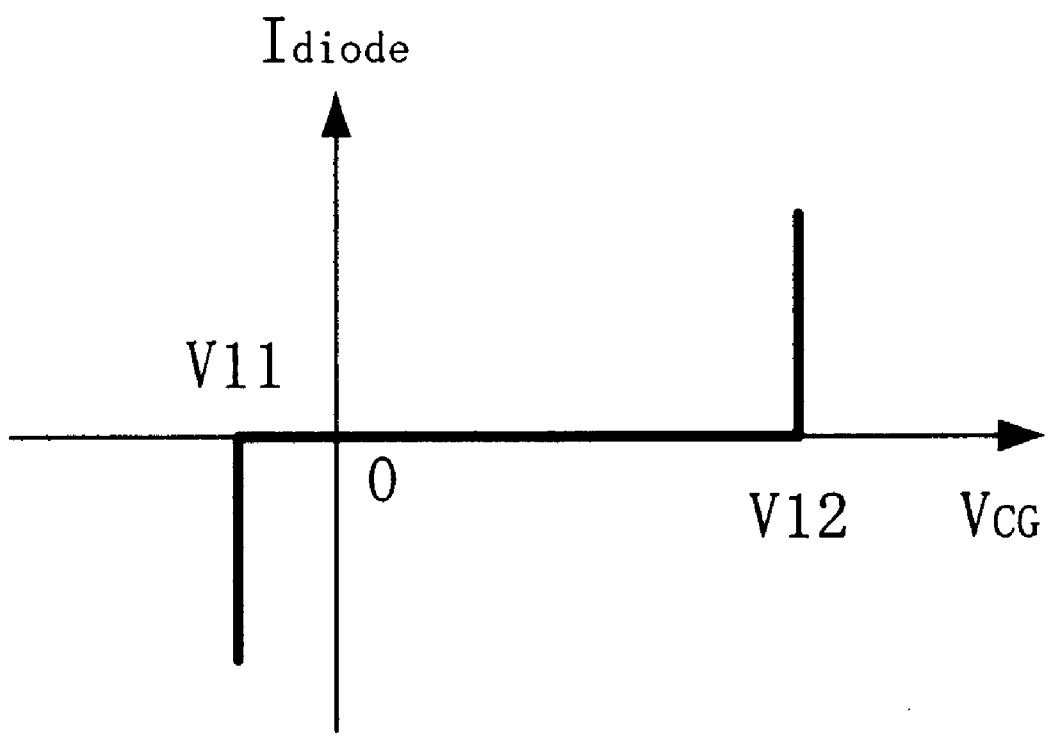
FIG. 15 is a graph illustrating an I-V characteristic of the known charge buildup damage reducer.

FIG. 12 illustrates I-V characteristics of the twin diodes where the potential levels $V_{NW}$ and $V_{PW}$ at the n- and p-wells 32N and 32P are set equal to the first and second control voltages $V_{PP}$ and $V_{ee}$, respectively. As shown in FIG. 12, where the potential levels $V_{NW}$ and $V_{PW}$ at the n- and p-wells 32N and 32P are set to $V_{PP}$ and $V_{ee}$, respectively, if the voltage $V_{CG}$ applied to the control gate 37 is V3+$V_{ee}$ or less, then the backward diode 14b is forward biased and a forward current flows therethrough. Also, if the voltage $V_{CG}$ applied to the control gate 37 is V1+$V_{PP}$ or more, then the forward diode 14a is forward biased and a forward current flows therethrough. That is to say, where the potential levels $V_{NW}$ and $V_{PW}$ at the n- and p-wells 32N and 32P are set equal to the first and second control voltages $V_{PP}$ and $V_{ee}$, respectively, no current flows through the twin diodes while the voltage $V_{CG}$ applied to the control gate 37 is from V3+$V_{ee}$ through V1+$V_{PP}$.

Hereinafter, it will be described how the memory device and NW/DNW and PW voltage controllers of the third embodiment operate. In the following illustrative example, the gate negative voltage erase method is applied to the memory device in question.

To realize the same operation as that defined by the gate negative voltage erase method shown in Table 1, specific values of the first and second control voltages $V_{PP}$ and $V_{ee}$ output from the NW/DNW and PW voltage controllers 25 and 23, respectively, are also shown in Table 2.

As shown in Table 2, the voltage $V_{CG}$ applied to the control gate 37 during a write operation is from 0 V through 12 V. To allow no current to flow through the twin diodes in this applied voltage range, the first and second control voltages $V_{PP}$ and $V_{ee}$ may be set to 12 V and 0 V, respectively. In that case, no current flows through the damage reducer 14C unless charges build up to a predetermined quantity or more in the control gate 37 as a result of dry etching in the fabrication process. Accordingly, while the memory device is operating normally, no charges leak out of the control gate 37.

The voltage $V_{CG}$ applied to the control gate 37 during an erase operation is from −8 V through 0 V. To allow no current to flow through the twin diodes in this applied voltage range, the first and second control voltages $V_{PP}$ and $V_{ee}$ may be set to 0 V and −8 V, respectively.

The voltage $V_{CG}$ applied to the control gate 37 during a read operation is from 0 V through 5 V. To allow no current to flow through the twin diodes in this applied voltage range, the first and second control voltages $V_{PP}$ and $V_{ee}$ may be set to 5 V and 0 V, respectively.

During a metallization process on the other hand, the first and second control voltages $V_{PP}$ and $V_{ee}$ are approximately 0 V. In that case, the voltage $V_{CG}$ applied to the control gate 37 is limited to the range from V3 (about −0.6 V) to V1 (about 0.6 V). Accordingly, no charge buildup will occur at the control gate 37 and the considerable decrease in reliability of the memory cell is avoidable.

As described above, in the third embodiment, the twin diodes, consisting of the forward and backward diodes 14a and 14b, are used as the damage reducer 14C. Also, the potential levels $V_{NW}$ and $V_{PW}$ at the n- and p-wells 32N and 32P for the forward and backward diodes 14a and 14b are changed by the NW/DNW and PW voltage controllers 25 and 23, respectively, depending on a state in which the memory cell 11 is driven. Thus, the gate negative voltage erase method is applicable to the damage reducer 14C.

In addition, since the damage reducer is implemented as twin diodes, the potential level at the control gate 37 can be limited to a very narrow range from −0.6 V to +0.6 V during the metallization process. As a result, the decrease in reliability of the memory device can be eliminated almost completely.

In the foregoing embodiments, each of the diodes for the charge buildup damage reducer 14A, 14B or 14C is made up of doped regions defined in the wells of the semiconductor substrate 33. Alternatively, each diode may have any other structure.

The effects of the present invention, i.e., reduction in damage resulting from charge buildup during a metallization process, are attainable only when the control gate 37 of the flash memory cell 11 is connected to one of the diodes included in the damage reducer 14A, 14B or 14C. For that reason, the control gate 37 of the memory cell 11 and the diode are preferably connected together by way of the lowermost interconnect layer included in a multilevel interconnect structure.

Then, the damage caused by the charge buildup phenomenon occurring during a fabrication process can be reduced not just in the lowermost interconnect layer but also in every upper-level interconnect layer.

What is claimed is:

1. A nonvolatile semiconductor memory device comprising:
   a memory cell including a floating gate and a control gate that are formed over a semiconductor substrate;
   a charge buildup damage reducer connected to the control gate; and
   damage reducer control means connected to the damage reducer,
   wherein the damage reducer controls a potential level at the control gate so that the potential level falls within a predetermined voltage range even if charge buildup occurs in the control gate during a metallization process,
   wherein the control means allows no current to flow through the damage reducer while the memory cell is being written, read or erased,
   wherein the damage reducer is a diode including first and second electrodes, the first electrode being connected to the control gate, and
   wherein the control means is connected to the second electrode of the diode and changes a voltage applied to the second electrode depending on whether the memory cell is being written, read or erased.

2. The device of claim 1, wherein the diode comprises:
   a well of a first conductivity type, which is formed in the substrate and used as the second electrode; and
   a doped region of a second conductivity type, which is defined in the well and used as the first electrode.

3. The device of claim 2, wherein the first and second conductivity types are n- and p-types, respectively, and
   wherein the control means sets a potential level at the n-well to a value equal to or greater than each voltage applied to the control gate while the memory cell is being written, read or erased.

4. The device of claim 2, wherein the first and second conductivity types are p- and n-types, respectively, and
   wherein the control means sets a potential level at the p-well to a value equal to or smaller than each voltage applied to the control gate while the memory cell is being written, read or erased.

5. The device of claim 1, wherein the potential level at the control gate during the metallization process is controlled to fall within a voltage range in which neither forward nor back current flows through the diode.

6. The device of claim 1, further comprising a multi-level interconnect structure, which is formed over the substrate and includes two or more interconnect layers,
   wherein the control gate and the diode are connected together via one of the interconnect layers that is closer to the substrate than any other interconnect layer in the interconnect structure.

7. A nonvolatile semiconductor memory device comprising:
   a memory cell including a floating gate and a control gate that are formed over a semiconductor substrate;
   a charge buildup damage reducer connected to the control gate; and
   damage reducer control means connected to the damage reducer,
   wherein the damage reducer controls a potential level at the control gate so that the potential level falls within a predetermined voltage range even if charge buildup occurs in the control gate during a metallization process,
   wherein the control means allows no current to flow through the damage reducer while the memory cell is being written, read or erased,
   wherein the damage reducer comprises first and second diodes formed in the substrate, each said diode including two electrodes with mutually opposite polarities, one of the two electrodes of the first diode and one of the two electrodes of the second diode being both connected to the control gate, and wherein the control means changes a voltage applied to the other electrode of the first diode and the other electrode of the second diode depending on whether the memory cell is being written, read or erased.

8. The device of claim 7, wherein the first diode comprises: a first well of a first conductivity type, which is formed in the substrate and used as the second electrode of the first diode; and a first doped region of a second conductivity type, which is defined in the first well and used as the first electrode of the first diode, and wherein the second diode comprises: a second well of the second conductivity type, which is formed in the substrate and used as the second electrode of the second diode; and a second doped region of the first conductivity type, which is defined in the second well and used as the first electrode of the second diode.

9. The device of claim 8, wherein the first and second conductivity types are n- and p-types, respectively, and wherein the control means sets a potential level at the n-well of the first diode to a value equal to or greater than each voltage applied to the control gate while the memory cell is being written, read or erased, and wherein the control means sets a potential level at the p-well of the second diode to a value equal to or smaller than each said voltage applied to the control gate while the memory cell is being written, read or erased.

10. The device of claim 7, wherein the potential level at the control gate during the metallization process is controlled to fall within a voltage range in which no forward current flows through the first or second diode.

11. The device of claim 7, further comprising a multi-level interconnect structure, which is formed over the substrate and includes two or more interconnect layers, wherein the control gate is connected to the first and second diodes via one of the interconnect layers that is closer to the substrate than any other interconnect layer in the interconnect structure.

* * * * *

UNITED STATES PATENT AND TRADEMARK OFFICE
CERTIFICATE OF CORRECTION

PATENT NO.    : 6,501,683 B2
DATED         : December 31, 2002
INVENTOR(S)   : Keita Takahashi It is certified that error appears in the above-identified patent and that said Letters Patent is hereby corrected as shown below:

<u>Title page,</u>
Item [73], Assignee, delete "Matsushita Electric Co., Ltd." add -- Matsushita Electric Industrial Co., Ltd. --

Item [56], References Cited, FOREIGN PATENT DOCUMENTS, delete "JP 411233654 A and JP 020010606871" add -- JP 11233654A and JP 02001060687 A --

Signed and Sealed this

Twelfth Day of August, 2003

JAMES E. ROGAN
*Director of the United States Patent and Trademark Office*